United States Patent
Hashim et al.

(10) Patent No.: US 10,679,962 B2
(45) Date of Patent: Jun. 9, 2020

(54) CAPILLARY JIG FOR WIRE BONDING AND METHOD OF INSTALLING A CAPILLARY

(71) Applicant: Texas Instruments Incorporated, Dallas, TX (US)

(72) Inventors: Mohd Azri Hashim, Selangor (MY); Mohd Muzamir Kamalluddin, Kedah (MY)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 686 days.

(21) Appl. No.: 15/019,692

(22) Filed: Feb. 9, 2016

(65) Prior Publication Data
US 2017/0229419 A1    Aug. 10, 2017

(51) Int. Cl.
*B23P 19/00* (2006.01)
*H01L 23/00* (2006.01)
*B23K 20/00* (2006.01)

(52) U.S. Cl.
CPC ............ *H01L 24/78* (2013.01); *B23K 20/005* (2013.01); *H01L 2224/45015* (2013.01); *H01L 2224/78301* (2013.01); *H01L 2224/78705* (2013.01); *H01L 2924/00014* (2013.01)

(58) Field of Classification Search
CPC ....... H01L 23/00; H01L 24/78; B23K 20/005; B23K 20/26
See application file for complete search history.

(56) References Cited

U.S. PATENT DOCUMENTS

| | | | | |
|---|---|---|---|---|
| 5,699,951 A * | 12/1997 | Miyoshi | ............... | B23K 20/004 228/4.5 |
| 5,829,663 A * | 11/1998 | Khelemsky | .......... | B23K 20/005 228/1.1 |
| 5,934,543 A * | 8/1999 | Koduri | ................. | B23K 20/005 228/102 |
| 6,065,663 A * | 5/2000 | Koduri | ................. | B23K 20/005 156/580.1 |
| 6,073,827 A * | 6/2000 | Razon | .................. | B23K 20/005 228/1.1 |
| 6,112,972 A * | 9/2000 | Koduri | ................. | B23K 20/004 228/102 |
| 6,215,195 B1 * | 4/2001 | Koduri | ................. | B23K 20/004 156/580.1 |
| 6,273,321 B1 * | 8/2001 | Koduri | ................. | B23K 20/004 228/102 |
| 6,511,117 B1 * | 1/2003 | Henning | ................... | B60J 7/102 296/100.12 |
| 6,523,733 B2 * | 2/2003 | Miller | .................. | B23K 20/005 228/110.1 |
| 7,367,979 B2 * | 5/2008 | Abdelgany | .......... | A61B 17/862 606/104 |
| 8,459,530 B2 * | 6/2013 | Zhang | .................. | B23K 20/005 228/180.5 |
| 8,601,779 B1 * | 12/2013 | Figgins | ................ | A01D 34/283 56/181 |

(Continued)

*Primary Examiner* — Paul D Kim
(74) *Attorney, Agent, or Firm* — Ronald O. Neerings; Charles A. Brill; Frank D. Cimino (57) ABSTRACT

A jig for holding a wire bonding capillary includes a first arm and an opening in the first arm, wherein a wire bonding capillary is receivable within the opening. A second arm is pivotally attached to the first arm. The second arm has a surface facing the first arm, wherein the surface is contactable with a capillary mount of a wire bonding machine.

28 Claims, 6 Drawing Sheets

(56) References Cited

U.S. PATENT DOCUMENTS

2005/0188469 A1\* 9/2005 Abdelgany .......... A61B 17/862
   7/164
2007/0227313 A1\* 10/2007 Rozo .................. B25B 7/02
   81/426
2017/0209955 A1\* 7/2017 Tabio .................. B23K 20/005

\* cited by examiner

CAPILLARY JIG FOR WIRE BONDING AND METHOD OF INSTALLING A CAPILLARY

BACKGROUND

In semiconductor manufacturing processes, wire bonding plays an important and critical role. Wire bonding is the method that provides electrical paths for power and signal distribution between a component, such as a die, and leads, such as lead frames for the die.

A wire bonding machine electrically and mechanically connects a wire between two locations to form a wire bond between the two locations. The wire is typically very thin and the locations are extremely small, so the wire bonding machine has to be very precise. One area of the wire bonding machine requiring precision is a capillary from which the wire is fed from the wire bonding machine. If the capillary is not positioned correctly within the wire bonding machine, the wire bonds will not be correct, which may cause failure of the devices in which the wire bonds are located.

Presently, capillaries are placed within the wire bonding machines by hand. For example, a user removes a capillary from a vial and positions it within the wire bonding machine using tweezers or similar devices. The user secures the capillary into the wire bonding machine while maintaining it in position with the tweezers. The result is that many capillaries are not positioned correctly within the wire bonding machines or they are damaged, which results in the above-described incorrect wire bonds.

SUMMARY

A jig for holding a wire bonding capillary includes a first arm and an opening in the first arm, wherein a wire bonding capillary is receivable within the opening. A second arm is pivotally attached to the first arm. The second arm has a surface facing the first arm, wherein the surface is contactable with a capillary mount of a wire bonding machine.

DETAILED DESCRIPTION

Wire bonding in semiconductor fabrication is the portion of fabrication where conductors are connected between different devices. For example, a conductor, referred to as a wire bond, may be electrically and mechanically connected between an integrated circuit die and a lead, such as a lead frame. Wire bonds may also be connected between other components, such as components on integrated circuits. The wires are bonded to very small bond pads, which require very precise positioning in order to bond the wires to the pads.

The wire used by wire bonding machines is typically very thin, so the wire bonding machines have to be very precise. In some examples, the wires have diameters between 25 um and 33 um. One area of the wire bonding machine requiring precision is a capillary from which the wire is fed out of the wire bonding machine. If the capillary is not positioned correctly within the wire bonding machine, the wire bonds will not be correct, which may cause failure of the devices in which the wire bonds are connected. For example, the wires may be bonded in the wrong location or the contours of the wires may not be as anticipated.

Figure 1A:
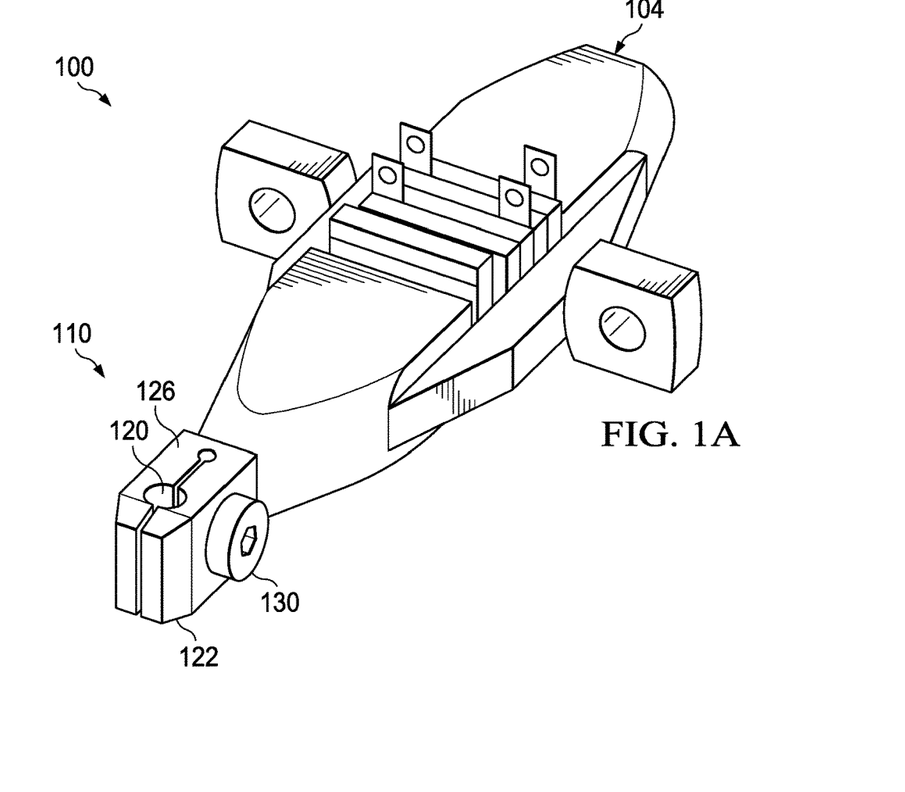
FIG. 1A is a top isometric view of a transducer portion of a wire bonding machine 100.
Figure 1B:
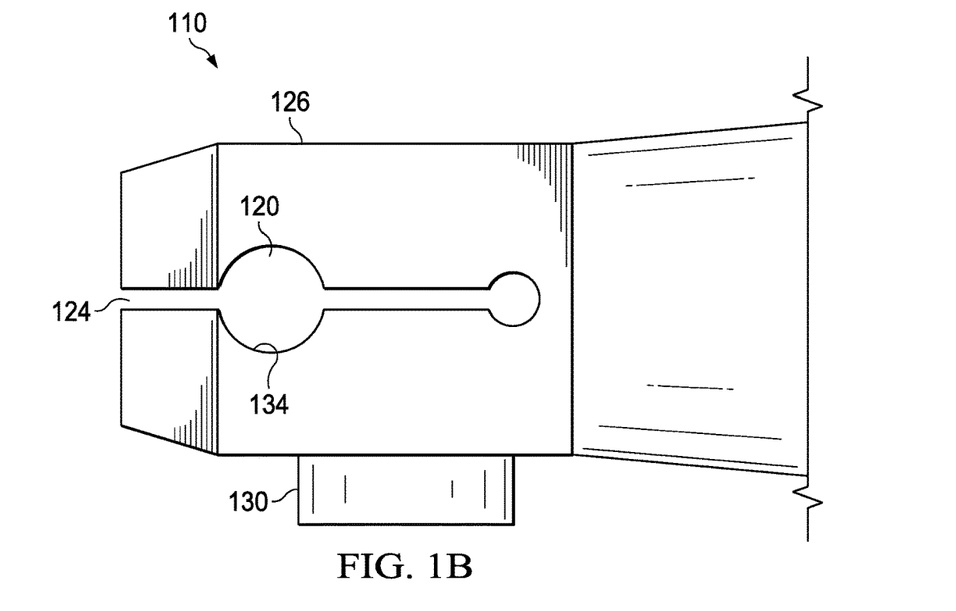
FIG. 1B is a top plan view of the capillary mount of the wire bonding machine of FIG. 1A.

FIG. 1A is a top isometric view of a transducer portion of a wire bonding machine 100. The wire bonding machine 100 includes a transducer 104 to which a capillary mount 110 is attached. FIG. 1B is a top plan view of the capillary mount 110 of FIG. 1A. Other wire bonding machines may have slightly different capillary mounts than the capillary mount 110 described herein. The transducer 104 moves the transducer mount 110 and a capillary (not shown in FIG. 1A or FIG. 1B) to specific locations to perform conventional wire bonding.

Figure 2A:
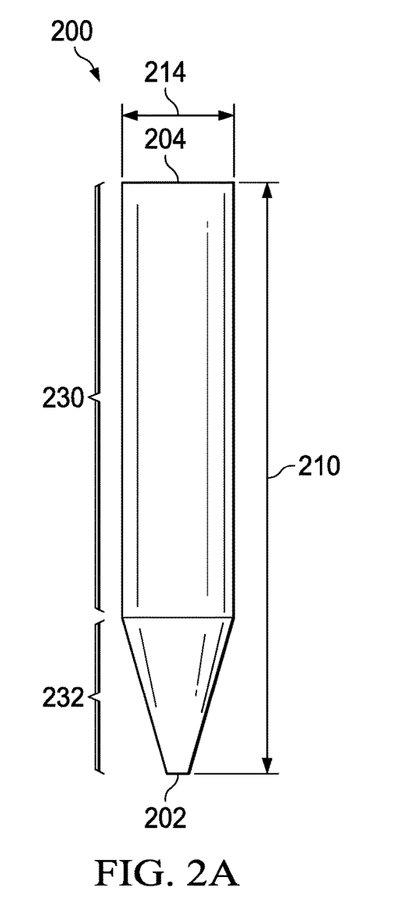
FIG. 2A is an elevation view of an example capillary.
Figure 2B:
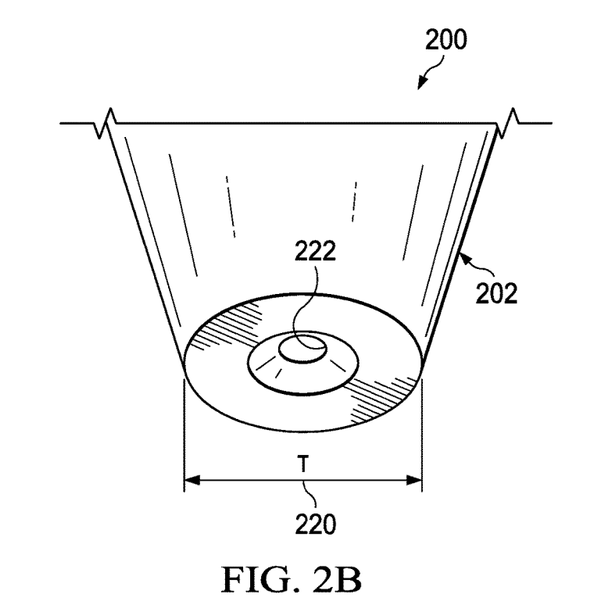
FIG. 2B is an enlarged isometric view of the tip of the capillary of FIG. 2A.
Figure 3A:
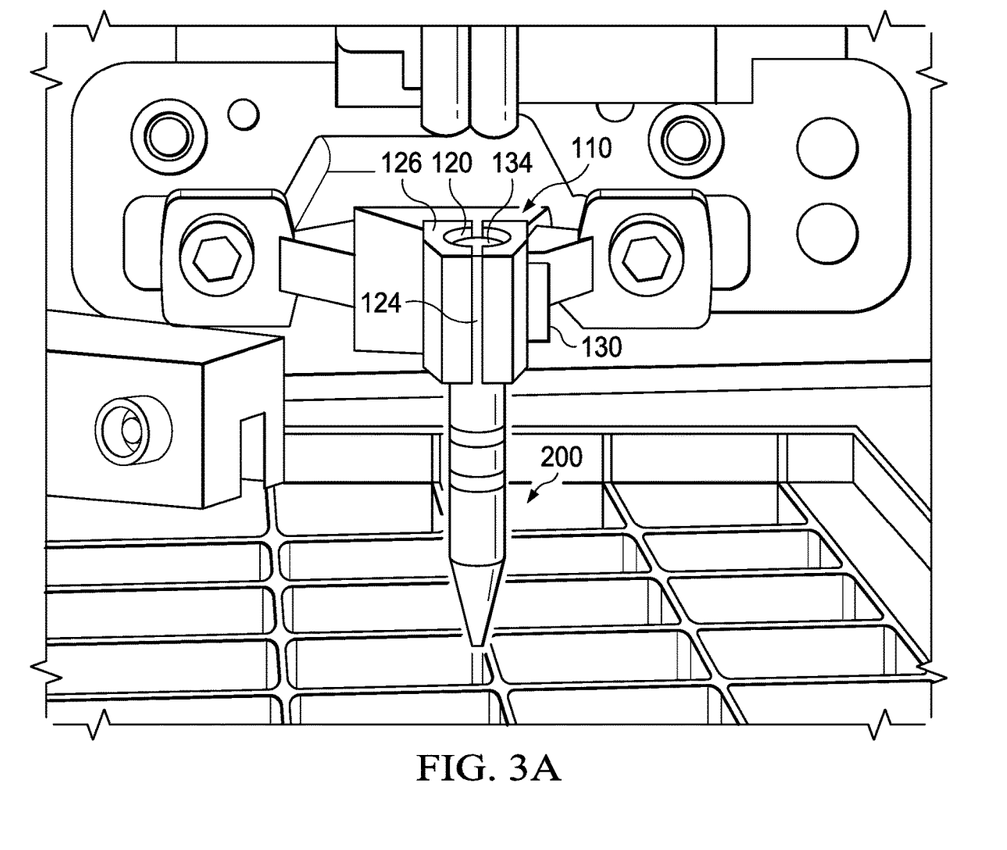
FIG. 3A is a front isometric view of the capillary of FIG. 2A properly inserted into the capillary mount of FIG. 1A.
Figure 3B:
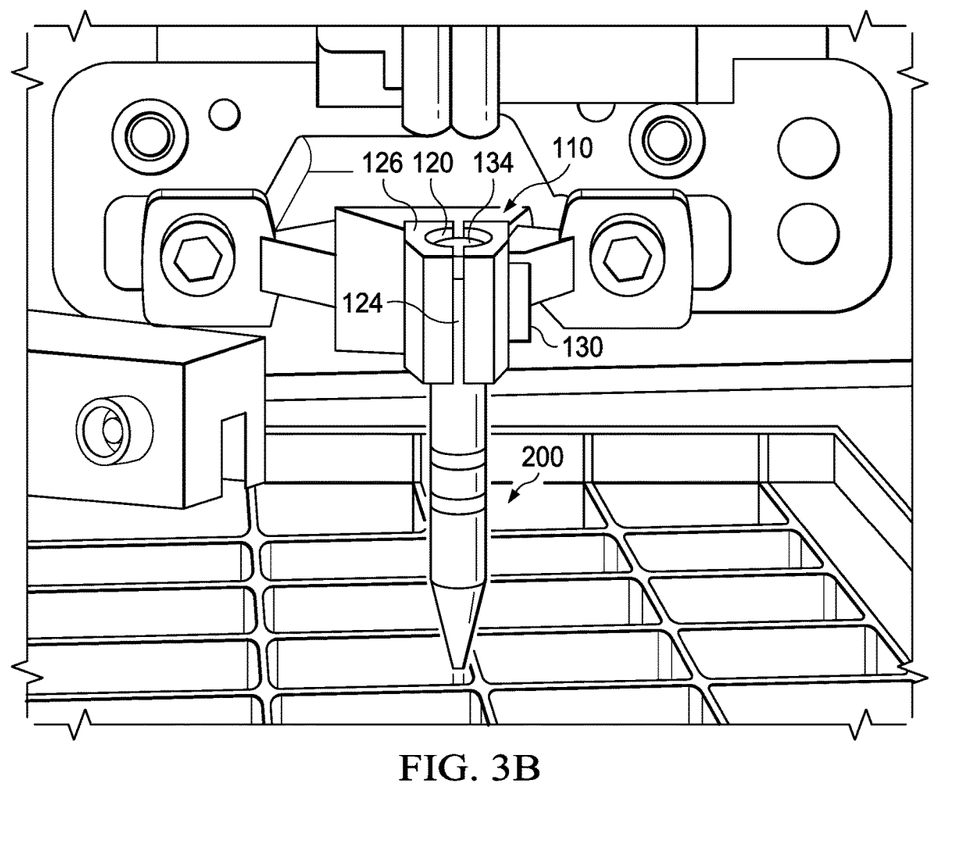
FIG. 3B is a front isometric view of the capillary of FIG. 2A improperly inserted into the capillary mount of FIG. 1A.

FIG. 2A is an elevation view of an example capillary 200 that is receivable in the capillary mount 110. FIG. 2B is an isometric view of the tip 202 of the capillary 200. FIG. 3A is a front isometric view of the capillary 200 of FIG. 2A properly inserted into the capillary mount 110 of FIG. 1A. FIG. 3B is a front isometric view of the capillary 200 of FIG. 2A improperly inserted into the capillary mount 110 of FIG. 1A. Referring to FIG. 2A, the capillary 200 has an end 204 that is opposite the tip 202 and has a length 210 extending between the tip 202 and the end 204. The length 210 of a conventional capillary is typically between 9.52 mm and 19.05 mm. The capillary 200 has a diameter 214, which is typically about 1.58 mm. The small dimensions of the capillary 200 make it difficult to handle manually and load within the capillary mount 110.

As shown in FIGS. 2A and 2B, the capillary has a tip 202 that has a diameter 220. The diameter 220 may be between 140 um and 229 um for bond wires having diameters between 25 um and 33 um. The tip 202 has a hole 222 from which the wire extends. The hole 222 extends the length of the capillary 200 and serves to feed the wire to a surface being wire bonded by the wire bonding machine 100, FIG. 1A.

The capillary 200 has a cylindrical portion 230 and a tapered portion 232. The cylindrical portion 230 may be cylindrical or substantially cylindrical and is received in the capillary mount 110 as described below. The tapered portion 232 is a portion of the capillary 200 that is the transition between the cylindrical portion 230 and the tip 202. The tapered portion 232 may be linear or it may have a nonlinear shape.

Referring to FIGS. 1A and 1B, the capillary mount 110 includes an opening 120 that receives the capillary 200, FIG. 2A. For example, the cylindrical portion 230 of the capillary 200 is received in the opening 120. The capillary mount 110 has a lower portion 122 from which the capillary 200 is inserted into the opening 120. The opening 120 has a slot 124 that enables the capillary mount 110 to squeeze onto the capillary 200 by reducing the size of the opening 120. An upper surface 126 is located opposite the lower portion 122. In the example of FIGS. 1A and 1B, a screw 130 is tightened to close the slot 124, which tightens the hole 120 onto the capillary 200. The screw 130 is tightened to a specific torque to maintain friction between the capillary 200 and the capillary mount 110 to prevent the capillary 200 from moving within the opening 120. The force exerted by the screw 130 does not squeeze the opening 120 so as to damage the capillary 200. In some examples, the capillary mount 110 includes a stopper 134 that limits the distance within the opening 120 that the capillary 200 may be inserted into the opening 120.

The conventional process for inserting a capillary 200 into the opening 120 is performed manually. The screw 130 in the capillary mount 110 is loosened to expand the opening 120 and to remove an existing capillary. Tweezers or similar devices are used to remove a new capillary 200 from a storage container (not shown), such as a storage vial. The capillary 200, being held by the tweezers, is moved upward into the opening 120 from the lower portion 122 of the capillary mount 110. The capillary 200 is positioned against the stopper 134 and is manually held in that position. While the capillary 200 is manually held in position against the stopper 134, the screw 130 is tightened to secure the capillary 200 into the capillary mount 110 as shown in FIG. 3A.

The manual insertion of the capillary 200 into the capillary mount 110 requires manual dexterity to position the very small capillary 200 into the opening 120 and to maintain the capillary in this position while tightening the screw 130. If the capillary 200 is not properly mounted within the capillary mount 110, the results may appear as shown in FIG. 3B. As shown in FIG. 3B, the tip 202 of the capillary 200 extends further from the lower portion 122 of the capillary mount 110 than it does with reference to FIG. 3A. The wire bonding machine 100 operates the transducer 104 to move the capillary tip 202 to very precise locations, so it is critical that the capillary 200 be precisely located within and relative to the capillary mount 110. When the capillary 200 is mounted incorrectly as shown in FIG. 3B, the wire bonds fabricated by the wire bonding machine 100 may be defective, which results in defective devices.

Figure 4:
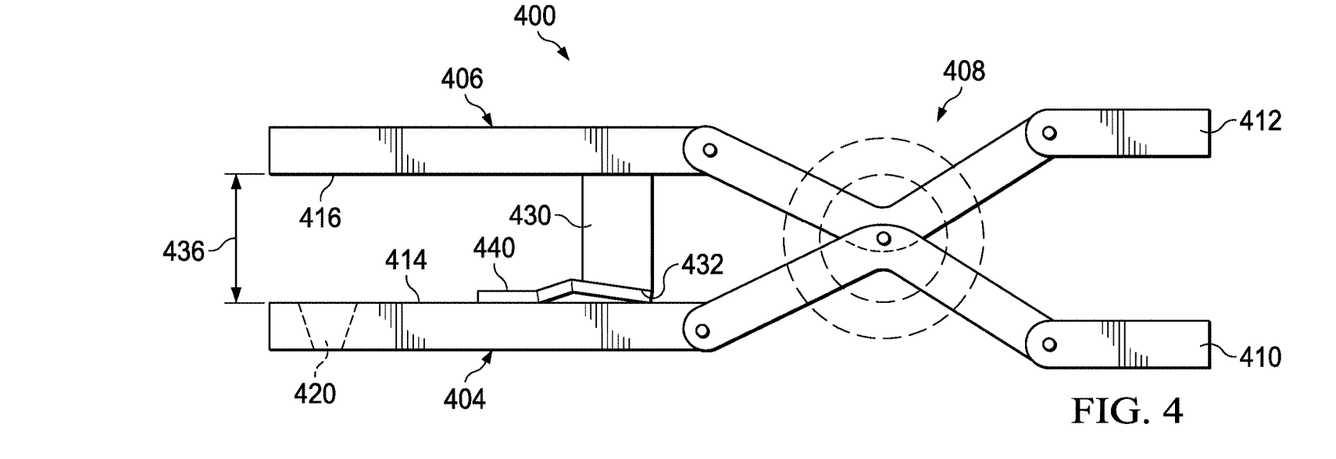
FIG. 4 is a side elevation view of an example jig that positions the capillary of FIG. 2A into the capillary mount of FIGS. 1A and 1B.

FIG. 4 is a side elevation view of an example jig 400 that positions and maintains the capillary 200 in the capillary mount 110 during the period that the user tightens the screw 130. The jig 400 includes a first arm 404 and a second arm 406 that are pivotally connected at a pivot area 408. The first arm 404 is connected to a first handle 410 and the second arm is connected to a second handle 412. The first arm 404 has a surface 414 that faces a surface 416 of the second arm 406. The first handle 410 and the second handle 412 are for the person replacing the capillary 200 to grasp and move during replacement of the capillary 200. When the first handle 410 and the second handle 412 are forced together, the first arm 404 and the second arm 406 are forced apart and vice versa.

The first arm 404 has an opening 420 that receives the tapered portion 232 of the capillary 200. The opening 420 is tapered or shaped to match the shape of the tapered portion 232 of the capillary 200 to prevent the capillary 200 from moving relative to the first arm 404. For example, if the tapered portion 232 is linear having an angle, the opening 420 is also tapered and linear at the same angle or substantially the same angle as the capillary 200. In some examples, the opening 420 is configured to receive a portion of the cylindrical portion 230 of the capillary 200. Accordingly, the opening 420 would have a cylindrical portion located proximate the surface 414 and a tapered portion located further into the opening 420. The configuration of the opening 420 and the tapered portion 232 enables the capillary 200 to be maintained in a fixed position relative to the jig 400.

The surface 416 has a member 430 attached thereto that extends toward the surface 414. The member 430 has an end 432 that contacts the first arm 404 or an element attached to the first arm 404. The length of the member 430 limits the distance 436 in which the first arm 404 may come to the second arm 406, which assures proper placement of the capillary 200 in the capillary mount 110 as described below. The length of the member 430 further prevents the capillary 200 from being pressed too hard into the capillary mount 110, which would cause damage to the capillary 200 or the capillary mount 110.

Figure 5:
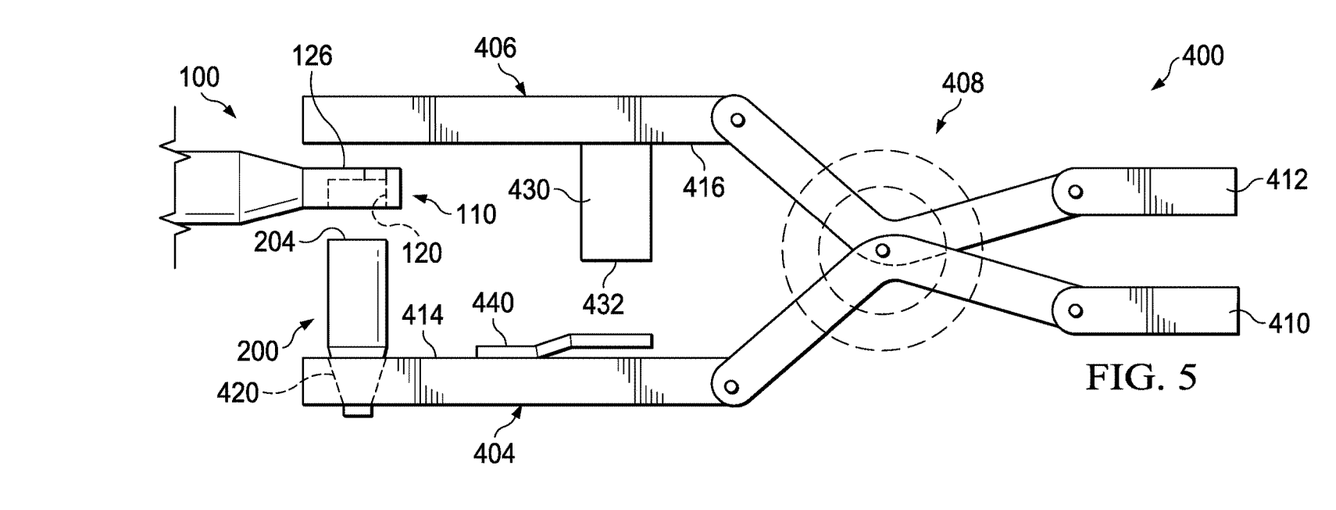
FIG. 5 is a side elevation view of the jig of FIG. 4 in an open state.

The example jig 400 includes a spring device 440 attached to the surface 414. The jig 400 illustrated in FIG. 4 is in a closed state wherein the end 432 of the member 430 is in contact with the spring device 440. Additional reference is made to FIG. 5, which is a side elevation view of the jig 400 in an open state whereby the first arm 404 and the second arm 406 are separated from each other by a distance greater than they are when the jig 400 is in a closed state. The capillary 200 is placed within the opening 420 when the jig 400 is in the open state as shown in FIG. 5. The jig 400 is then moved proximate the transducer 100 so that the end 204 of the capillary 200 is proximate the opening 120 in the transducer mount 110 and the surface 416 of the second arm 406 is located proximate the upper surface 126 of the capillary mount 110.

Figure 6:
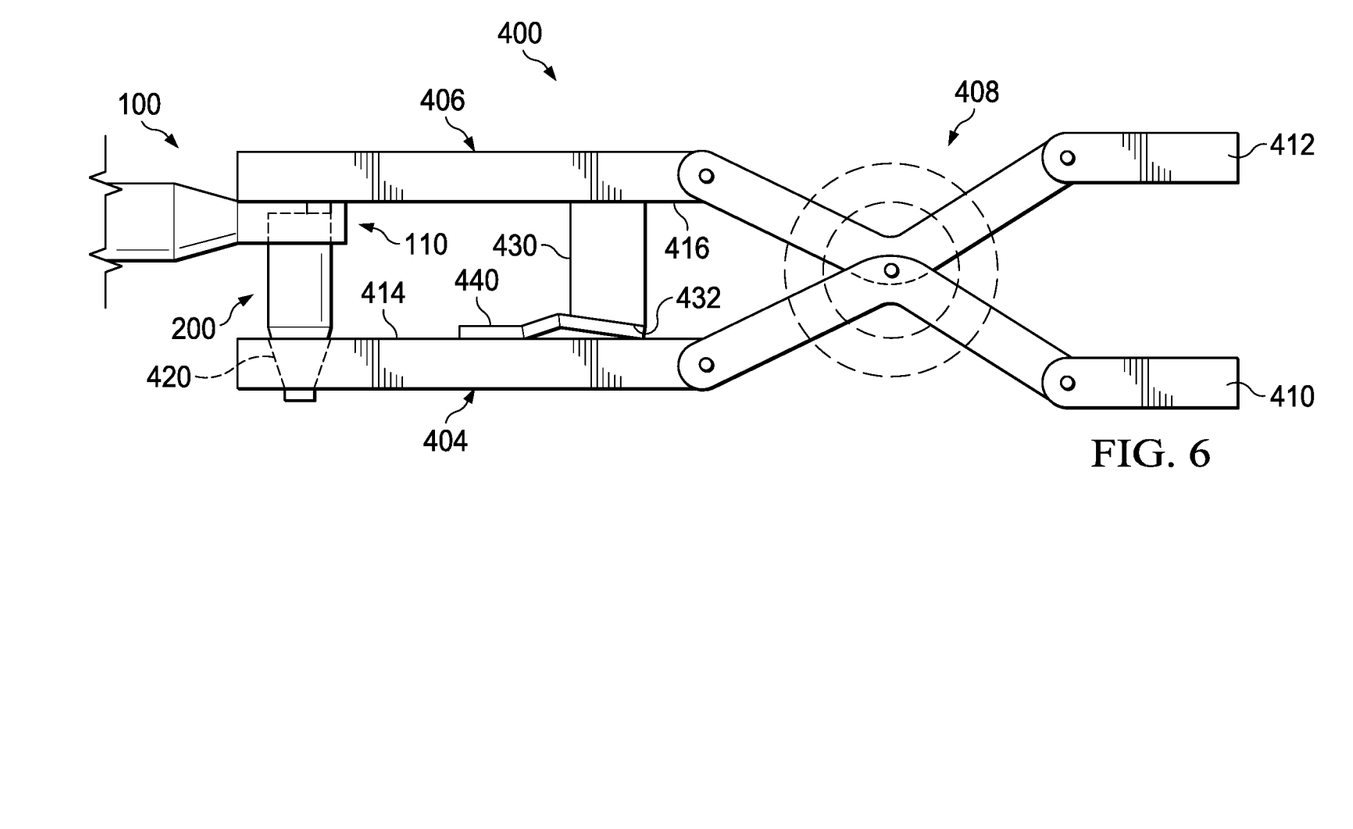
FIG. 6 is a side elevation view of the jig of FIG. 4 in a closed state wherein the capillary is being mounted in the capillary mount of FIGS. 1A and 1B.

When the jig 400 is located proximate the capillary mount 110, the first arm 404 and the second arm 406 are moved toward each other to form a closed state of the jig 400. FIG. 6 is a side elevation view of the jig 400 of FIG. 4 in a closed state wherein the capillary 200 is being mounted in the capillary mount 110. In the closed state, the surface 416 contacts the upper surface 126 of the capillary mount 110 and the capillary 200 is forced within the opening 120.

The closed state of FIG. 6 is achieved by moving the first handle 410 and the second handle 412 away from to each other. As the first handle 410 and the second handle 412 are moved away from each other, the end 432 of the member 430 contacts the spring device 440 and compresses the spring device 440. The user can feel the resistant provided by the spring device 440 and knows that the first and second arms 404 and 406 are near to being as close together as possible. The spring device 440 also limits the force applied by the first and second arms 404 and 406 to prevent damage to the capillary 200 and/or the transducer 100 during insertion of the capillary into the opening 120. The length of the member 430 limits the distance between the first arm 404 and the second arm 406, which limits the distance the capillary 200 may be inserted into the opening 120. Accordingly, the use of the jig 400 enables proper insertion of the capillary 200 within the capillary mount 110 and lessens the probability of damage to the capillary 200.

In some examples, the jig 400 includes a spring or torsion device in the pivot area 408 that forces the jig 400 into the closed state. The torsion device enables a user to release the first and second handles 410 and 412 to cause the first and second arms 404 and 406 to close, so the capillary 200 is maintained in the opening 120 without the jig 400 being supported by a user. The user may then tighten the screw 130, FIGS. 1A and 1B, on the capillary mount 110 to secure the capillary 200 within the capillary mount 110.

Figure 7:
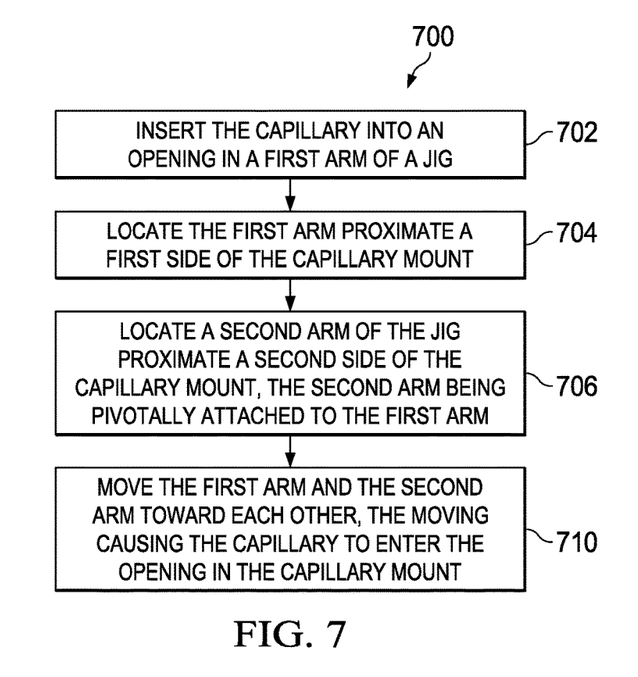
FIG. 7 is a flow chart describing the placement of a capillary within a capillary mount of a wire bonding machine.

FIG. 7 is a flow chart 700 that describes the placement of a capillary 200 within a capillary mount 110 of a wire bonding machine 100. Step 702 of the flow chart 700 includes inserting the capillary into an opening in a first arm of a jig. Step 704 includes locating the first arm proximate a first side of the capillary mount. Step 706 includes locating a second arm of the jig proximate a second side of the capillary mount, the second arm being pivotally attached to the first arm. Step 710 includes moving the first arm and the second arm toward each other, the moving causing the capillary to enter the opening in the capillary mount.

While some examples of wire bonding capillary jigs have been described in detail herein, it is to be understood that the inventive concepts may be otherwise variously embodied and employed and that the appended claims are intended to be construed to include such variations except insofar as limited by the prior art.

What is claimed is:

1. A jig for holding a wire bonding capillary, the jig comprising:
    a first arm;
    a tapered opening in the first arm, wherein the wire bonding capillary is receivable in the tapered opening; and
    a second arm pivotally attached to the first arm, the second arm having a surface facing the first arm.

2. The jig of claim 1, wherein the capillary has a cylindrical portion and a tapered portion and wherein the cylindrical portion is locatable between the first arm and the second arm.

3. The jig of claim 2, wherein the tapered portion of the capillary matches a shape of the tapered opening in the first arm.

4. The jig of claim 1, wherein the capillary has a cylindrical portion and a tapered portion and wherein at least a portion of the tapered portion is receivable in the tapered opening in the first arm.

5. The jig of claim 4, wherein the tapered opening in the first arm is tapered in the same shape as the tapered portion of the capillary.

6. The jig of claim 5, wherein the tapered opening in the first arm prevents the capillary from moving relative to the first arm.

7. The jig of claim 5, wherein the tapered portion of the capillary matches the shape of the tapered opening in the first arm.

8. The jig of claim 4, wherein the tapered opening in the first arm prevents the capillary from moving relative to the first arm.

9. The jig of claim 4, wherein the tapered portion of the capillary matches the shape of the tapered opening in the first arm.

10. The jig of claim 1, wherein the capillary has a cylindrical portion and a tapered portion and wherein the tapered opening in the first arm is tapered or shaped to match the shape of the tapered portion of the capillary.

11. The jig of claim 10, wherein the tapered opening in the first arm prevents the capillary from moving relative to the first arm.

12. The jig of claim 10, wherein the tapered portion of the capillary matches a shape of the tapered opening in the first arm.

13. The jig of claim 1, further comprising a torsion device coupled to the first arm and the second arm for forcing the first arm and the second arm together.

14. The jig of claim 1, further comprising a member attached to one of the first arm or the second arm, the member contactable with the other of the first arm and the second arm, the member having a length that limits a distance between the first arm and the second arm.

15. The jig of claim 14, further comprising a spring mechanism attached to the first or second arm contactable by the member, wherein the member is contactable with the spring, and wherein a length of the spring limits the distance between the first arm and the second arm.

16. The jig of claim 14, further comprising a spring mechanism attached the first or second arm contactable by the member, wherein the member is contactable with the spring, and wherein the spring limits force applied between a capillary and capillary mount.

17. The jig of claim 1, wherein the first arm is substantially parallel to the second arm when the first arm is closest to the second arm, the capillary is received in the tapered opening in the first arm, and the surface of the second arm contacts a capillary mount.

18. The jig of claim 1, further comprising:
    a first handle connected to the first arm; and
    a second handle connected to the second arm.

19. The jig of claim 18, wherein the first arm and the second arm are forced together in response to the first handle and the second handle being forced apart.

20. The jig of claim 1, wherein the tapered opening in the first arm prevents the capillary from moving relative to the first arm.

21. A method for inserting a wire bond capillary into an opening in a capillary mount of a wire bonding machine, the method comprising:
    locating the capillary into an opening in a first arm of a jig;
    locating the first arm proximate a first side of the capillary mount;
    locating a second arm of the jig proximate a second side of the capillary mount, the second arm being pivotally attached to the first arm; and
    moving the first arm and the second arm toward each other, the moving causing the capillary to enter the opening in the capillary mount.

22. The method of claim 21, wherein the jig comprises a torsion device that forces the first and second arms together, wherein the method further comprises:
    applying a force to force the first arm and the second arm apart; and
    releasing the force to cause the torsion device to exert a force to force the first arm and the second arm together.

23. A method for inserting a wire bond capillary into an opening in a capillary mount of a wire bonding machine, the method comprising:
    locating the capillary into an opening in a first arm of a jig;
    securing the capillary to the capillary mount while the capillary is maintained in a position within the capillary mount by the jig;
    locating the first arm proximate a first side of the capillary mount;
    locating a second arm of the jig proximate a second side of the capillary mount, the second arm being pivotally attached to the first arm; and
    moving the first arm and the second atm toward each other, the moving causing the capillary to enter the opening in the capillary mount.

24. The method of claim 21 wherein the capillary has a tapered portion and a cylindrical portion and wherein the inserting includes inserting at least a portion of the tapered portion into the opening.

25. The method of claim 21 wherein the capillary has a tapered portion and a cylindrical portion and wherein the inserting includes inserting at least a portion of the tapered portion and at least a portion of the cylindrical portion into the opening.

26. The method of claim 21, wherein the moving includes applying a force between the jig and the capillary mount wherein the force maintains the jig in a fixed position relative to the capillary mount.

27. The method of claim 21, wherein the jig includes a first handle connected to the first arm and a second handle connected to the second arm, and wherein the method further comprises applying a force to the first and second handles, wherein the first and second arms move apart from each other in response to applying the force, and wherein the inserting is performed when the first and second arms are apart from each other.

28. A jig for holding a wire bonding capillary, the jig comprising:
   a first arm;
   a first handle connected to the first arm;
   a tapered opening in the first arm, wherein a first portion of the wire bonding capillary is receivable in the tapered opening;
   a second arm pivotally attached to the first arm, the second arm having a surface facing the first arm;
   a second handle connected to the second arm; and
   a torsion device for forcing the first arm and the second arm together.

* * * * *